United States Patent [19]
Yamagishi et al.

[11] Patent Number: 5,788,718
[45] Date of Patent: Aug. 4, 1998

[54] APPARATUS AND A METHOD FOR GROWING A SINGLE CRYSTAL

[75] Inventors: Hirotoshi Yamagishi; Kiyotaka Takano; Eiichi Iino; Masanori Kimura, all of Annaka, Japan

[73] Assignee: Shin-Etsu Handotai Co., Ltd., Tokyo, Japan

[21] Appl. No.: 777,731

[22] Filed: Dec. 20, 1996

[30] Foreign Application Priority Data

Dec. 27, 1995 [JP] Japan .................... 7-351847

[51] Int. Cl.⁶ .................................. C30B 35/20
[52] U.S. Cl. .................... 17/31; 17/13; 17/213; 17/217; 17/218
[58] Field of Search ................ 117/13, 31, 34, 117/210, 213, 217, 218, 222, 900

[56] References Cited

U.S. PATENT DOCUMENTS 5,316,742  5/1994  Tomioka et al. ............... 117/217

FOREIGN PATENT DOCUMENTS 404331791A  11/1992  Japan ................. 117/217
405330975A  12/1993  Japan ................. 117/217
405339092A  12/1993  Japan ................. 117/217

OTHER PUBLICATIONS

"Apparatus For Low to Medium Level Oxygen Czochralski Silicon Crystal Growth"; IBM Technical Disclosure Bulletin; vol. 28; No. 1; Jun. 1985.

*Primary Examiner*—Felisa Garrett
*Attorney, Agent, or Firm*—Ronald R. Snider

[57] ABSTRACT

An apparatus for growing a single crystal which comprises a quartz crucible in a chamber for containing a semiconductor melt from which a semiconductor single crystal rod is pulled, wherein there further comprises a cylinder concentrically surrounding the single crystal rod to be pulled whose top is connected to the edge of the opening at the center of the ceiling of the chamber in an airtight fashion and whose bottom hangs down toward the semiconductor melt, and a collar which spreads open upward and outward and whose outer circumferential part extends above the top end of the quartz crucible wherein the outer circumferential part is situated such that it does not touch the top end of the quartz crucible when said quartz crucible is at its highest position.

8 Claims, 3 Drawing Sheets

5,788,718

APPARATUS AND A METHOD FOR GROWING A SINGLE CRYSTAL

RELATED APPLICATION

This application claims the priority of Japanese Patent application No.7-351847 filed on Dec. 27, 1995, which is incorporated herein by reference.

BACKGROUND OF THE INVENTION

1. Field of the Invention

This invention relates in general to an apparatus and a method for growing a single crystal according to Czochralski method, and more particularly to an apparatus and a method for growing a semiconductor single crystal without dislocations due to silicon oxide which deposits on the top end of a quartz crucible when growing a semiconductor single crystal rod from a semiconductor melt contained in a quartz crucible.

2. The Prior Art

Czochralski method is widely used as a method for growing semiconductor single crystals, particularly silicon single crystals. In this method, a seed crystal is dipped in a silicon melt contained in a quartz crucible and then pulled upwardly to grow a silicon single crystal.

An apparatus for growing a single crystal according to Czochralski method comprises a quartz crucible which contains the polycrystalline silicon raw material, a graphite crucible which holds the quartz crucible, a heater placed around the graphite crucible and a heat insulating cylinder, all of which are housed in a chamber.

When growing a silicon single crystal using the aforementioned apparatus, polycrystalline silicon raw material is put into the quartz crucible, and the graphite crucible is heated from the sides by the heater which surrounds the graphite crucible circumferentially. The polycrystalline silicon in the quartz crucible is heated from the sides by the heater through the graphite crucible and the quartz crucible, and thus it melts and turns into a silicon melt. In this condition, a seed crystal hung from above is dipped in the silicon melt. Then, a silicon single crystal grows as a rod to provide a desired silicon single crystal as the seed crystal is pulled upwardly while being rotated.

In the pulling process of the single crystal rod, the amount of the silicon melt in the quartz crucible decreases as the silicon single crystal rod grows and the level of the silicon melt surface gradually lowers. Lowering of the level of the silicon melt surface, changes the thermal environment in the chamber, making it impossible to obtain a homogeneous silicon single crystal. Therefore, it is necessary to maintain the thermal environment substantially constant by keeping the position of the level of the silicon melt constant.

In order to keep the level position, the quartz crucible and the graphite crucible are provided to be able to move up-and-down as one unit so as to compensate for the decrease in the silicon melt.

During the pulling process of the single crystal rod, silicon oxide evaporates constantly from the silicon melt in the quartz crucible. Although most of it is discharged out of the chamber by the ambient gas of argon which is supplied during the pulling process, some of it deposits on the top end of the quartz crucible or on the inner wall of the chamber.

Since the chamber itself is cooled by cooling water which is circulated through the cooling water path provided in the surrounding wall of the chamber, the evaporated silicon oxide tends to cool down and deposit on the inner wall of the chamber. Silicon oxide tends to deposit there as well on the top end of the quartz crucible because of its lower temperature as the quartz crucible of the larger size has been used more often for manufacturing silicon wafers of the larger diameter for meeting demand in the recent years.

Particularly when the single crystal rod to be pulled is as large as 300 mm or more in diameter, the weight of polycrystalline silicon raw material initially loaded in the quartz crucible is 200 kg or more, and the diameter and the height of the quartz crucible inevitably becomes large as well. As the quartz crucible becomes taller, the distance from the top end of the quartz crucible to the heater which heats it up from below increases, and the temperature at the top end of the quartz crucible inevitably becomes lower, resulting in the problem of silicon oxide deposition.

As described above, silicon oxide deposits on the top end of the quartz crucible whose temperature is relatively low. It stacks up in layers and a part of it drops into the silicon melt and attaches to the single crystal rod which is being pulled. As a result, dislocations are introduced into the single crystal, causing yield reduction of the single crystal significantly.

For a method of preventing such silicon oxide deposition, Japanese laid-open patent publication Tokkai Hei 1-65086 discloses a method of providing a cylinder which concentrically surrounds the single crystal rod which is to be pulled and hangs down toward the silicon melt in the quartz crucible, and a collar which spreads open upward and outward to prevent the deposited silicon oxide from falling into the silicon melt at the bottom of the cylinder.

However, even such method could not completely prevent the introduction of dislocations into the single crystal rod.

BRIEF SUMMARY OF THE INVENTION

The object of the present invention is to provide an apparatus and a method for growing a single crystal without deposition of silicon oxide on the top end of a quartz crucible of the apparatus.

The invention in one aspect provides an apparatus for growing a single crystal which comprises a quartz crucible in a chamber for containing a semiconductor melt from which a semiconductor single crystal rod is pulled, wherein there further comprises a cylinder concentrically surrounding the single crystal rod to be pulled whose top is connected to the edge of the opening at the center of the ceiling of the chamber in an airtight fashion and whose bottom hangs down toward the semiconductor melt, and a collar which spreads open upward and outward and whose outer circumferential part extends above the top end of the quartz crucible wherein the outer circumferential part is situated such that it does not touch the top end of the quartz crucible when the quartz crucible is at its highest position.

In the above apparatus, the collar may be made of high purity graphite, a multi-layered heat insulator may be provided to cover the upper surface of the collar and the upper surface of the insulator may be further covered with high purity graphite.

The surface of the collar covered with the high purity graphite may be coated with a material selected from graphite, silicon carbide or silicon nitride deposition, by means of the vapor decomposition method. A horizontal area may be provided on the outer circumferential part of the collar.

The invention in another aspect provides a method for growing a single crystal which comprises the step of pulling a semiconductor single crystal rod from a semiconductor melt contained in a quartz crucible to grow a semiconductor single crystal, wherein at least the temperature at the top of the quartz crucible is maintained at 950° C. or higher during the pulling step of the semiconductor single crystal rod.

DETAILED DESCRIPTION

Figure 1:
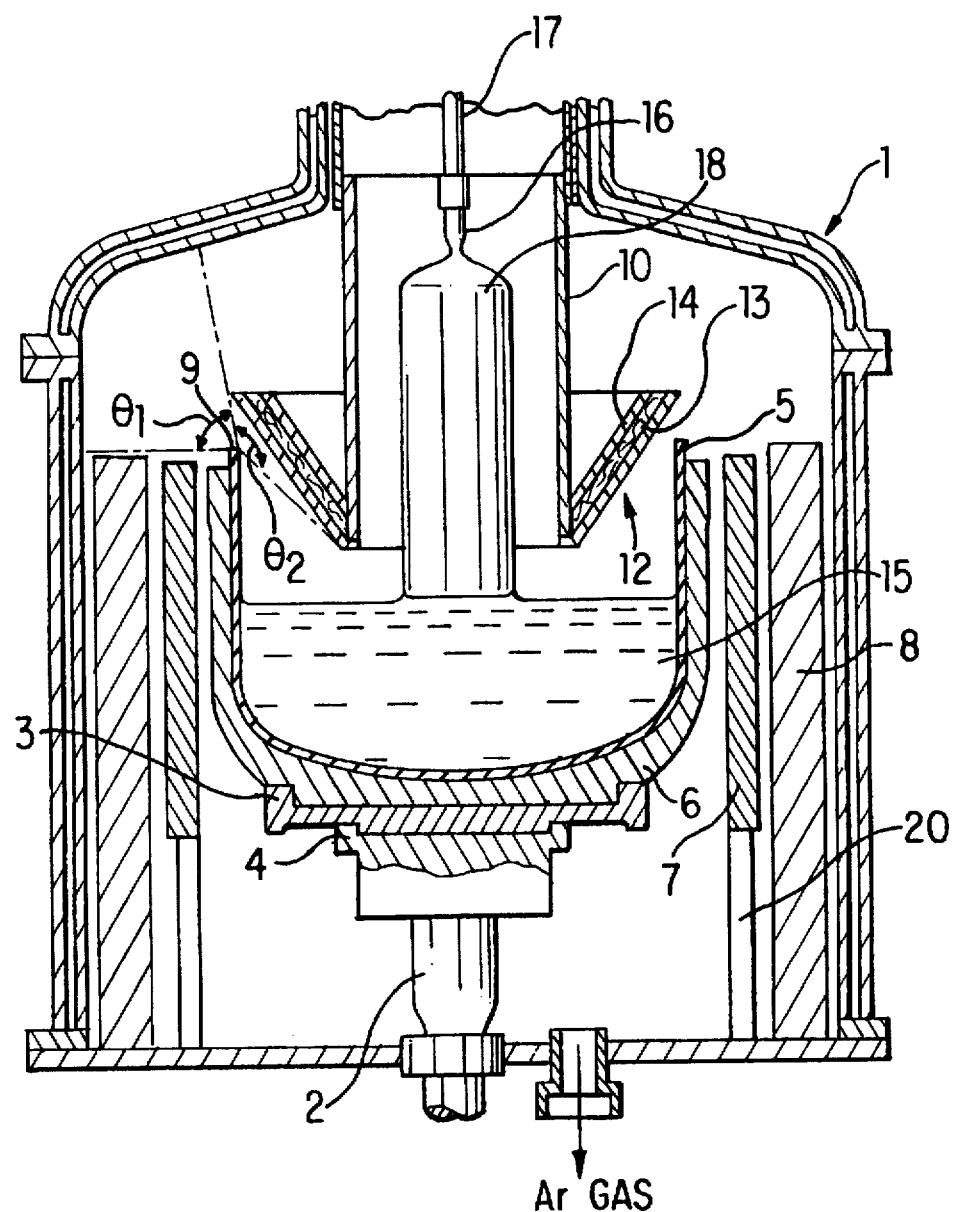
FIG. 1 is a vertical sectional view showing an apparatus for growing a single crystal according to an embodiment of the invention.

The invention is described in detail below.

The inventors conducted earnest research and discovered that deposition and adhesion of silicon oxide on the top end of the quartz crucible can be prevented by maintaining the temperature of the top end of the quartz crucible at 950° C. or higher during the pulling process of the single crystal rod.

The inventors also discovered that the temperature of the top end of said quartz crucible can be maintained at 950° C. or higher, by providing a cylinder concentrically surrounding the single crystal rod to be pulled whose top end is connected to the edge of the opening at the center of the ceiling of the chamber in an airtight fashion and whose bottom hangs down toward the semiconductor melt, and a collar which spreads open upward and outward and whose outer circumferential part extends above the top end of the quartz crucible wherein the outer circumferential part is situated such that it does not touch the top end of the quartz crucible when the quartz crucible is at its highest position.

Since the outer circumferential part of the collar extends above the top end of the quartz crucible, the angle of directly glancing at the inner wall of the chamber from the top end of the quartz crucible, hereafter referred to as "the stereo angle", decreases due to obstruction by the collar, whereas the angle of directly glancing at the bottom surface of the collar from the top and of the quartz crucible becomes very large. Heat efflux from the top end of the quartz crucible occurs via radiation heat transfer, and the amount of heat transfer is proportional to "$T^4-T_a^4$", where T is the temperature of the radiation source (the top end of the quartz crucible) and Ta is the temperature of the radiation recipient.

Since the bottom of the collar is heated by the heater, its temperature is approximately the same as that of the top end of the quartz crucible, and therefore the amount of heat efflux per unit angle from the top end of the quartz crucible to the bottom end of the collar is estimated to be very small. On the other hand, the temperature Ta of the inner wall of the chamber which is cooled by the cooling water is approximately the same as the cooling water temperature, and therefore the amount of heat efflux per unit angle from the top end of the quartz crucible to the inner wall of the chamber is much larger.

Therefore, the amount of heat efflux from the quartz crucible would be as follows. Although the heat efflux per unit angle from the quartz crucible to the inner wall of the chamber which is cooled by the cooling water is large, the total amount of the heat efflux from the top end of the quartz crucible to the inner wall of the chamber is small, because the stereo angle of directly glancing at the inner wall of the chamber is small. The total amount of the heat efflux from the top end of the quartz crucible to the bottom end of the collar is also small, because the bottom end of the collar has approximately the same temperature as that of the top end of the quartz crucible due to high temperature heating from the heater, although the stereo angle of directly glancing at the bottom end of the collar is large.

As described thus far, the amount of the heat efflux from the top end of the quartz crucible is reduced in the present invention, and therefore the temperature reduction of the top end of the quartz crucible is prevented, preventing the deposition of silicon oxide.

The collar used in the invention should preferably be made as follows: it is made of high purity graphite; a multi-layered heat insulator is provided on and in contact with the top surface of said collar; and the top surface of the insulator has a high purity graphite covering on it. When the collar is configured this way, the temperature at the bottom end of the collar can be raised and the reduction in the temperature of the top end of the quartz crucible can be prevented even more reliably. That is, since the multi-layered heat insulator is provided such that it covers the top surface of the collar, the ratio of the heat which goes out of the top surface of the collar to the heat transferred from the heater to the bottom part of the collar decreases due to the multi-layered heat insulator. Therefore, the temperature reduction of the bottom surface of the collar is even more efficiently prevented. This helps prevent the temperature reduction of the top end of the quartz crucible and enhances the effective prevention of deposition and adhesion of silicon oxide on the top end of the quartz crucible.

It is even more preferable if the surface of the collar covered with the high purity graphite is coated with graphite, silicon carbide or silicon nitride deposition by means of the vapor phase decomposition method; because this would prevent heavy metal contamination of the silicon melt from the collar.

Furthermore, if a horizontal area, i.e. a flange, is provided on the outer circumferential part of the collar, then the stereo angle of directly glancing at the inner wall of the chamber from the top end of the quartz crucible becomes even smaller because of obstruction by the flange, and the stereo angle of directly glancing at the bottom surface of the collar, including the bottom end of the flange, will become even larger. Also, since the flange adds to the radiation heat received from the heater, the effect of maintaining the temperature of the top and of the quartz crucible increases.

Embodiments

An embodiment of the invention is described below by referring to the attached drawings.

FIG. 1 shows an embodiment of the apparatus for growing a single crystal according to the invention. In the center of a chamber 1 of an airtight tank shape, a hollow support axis 2 comes vertically from below and vertically stacked two support mounts 3 and 4 are installed on top of the support axis 2. Placed on top of the support mount 3 are a quartz crucible 5 which contains a silicon melt 15 and a graphite crucible 6 which surrounds and protects the quartz crucible 5. The quartz crucible 5 and the graphite crucible 6 are designed such that they can be moved up and down by driving the support axis 2 in the direction of the axis.

In the chamber 1, a cylindrical heater 7 is placed around the side of the quartz crucible 5 and the graphite crucible 6, and also a heat insulating cylinder 8 is placed around the heater 7. Electrodes 20 are placed on the bottom of the heater 7 to make vertical motions possible.

In the central upper part of the chamber 1, a cylinder 10 is provided which concentrically surrounds a single crystal rod 18 to be pulled wherein its top is connected to the edge of the opening at the center of the ceiling of the chamber 1 in an airtight fashion and its bottom hangs down toward the semiconductor melt 15 in the quartz crucible 5. A collar 12 is provided at the bottom of the cylinder 10.

Figure 2:
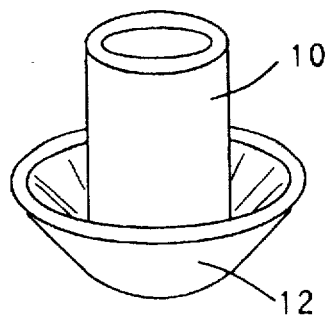
FIGS. 2 and 3 are perspective and sectional views showing an example of the collar part of the apparatus shown in FIG. 1.

The shape of the collar 12, as shown in FIG. 2, spreads open upward and outward and its outer circumferential part, as shown in FIG. 1, extends above the top end of the quartz crucible 5 wherein the outer circumferential part is situated such that it does not touch a top end 9 of the quartz crucible 5 when the quartz crucible 5 is at its highest position.

As shown in FIG. 1, the stereo angle $\theta$, directly glancing at the inner wall of the chamber 1 from the top end 9 of the quartz crucible 5 is relatively small because of obstruction by the collar 12. On the other hand, the stereo angle $\theta_2$ directly glancing at the bottom of the collar 12 from the top end 9 of the quartz crucible 5 is relatively large.

Figure 3:
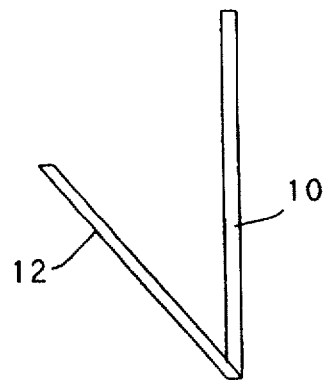
Figure 4:
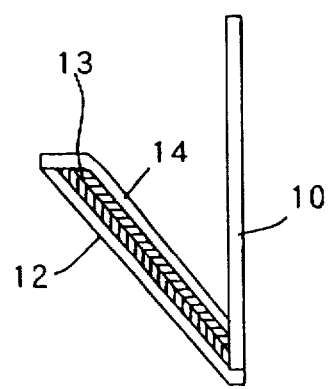
FIGS. 4 and 5 are sectional view showing other examples of the collar part.

The material for the main body of the collar 12 is not limited in particular, but it is preferable to be formed with high purity graphite in view of contamination prevention. Also, the collar 12 can be provided as the main body only at the bottom of the cylinder 10, as shown in FIG. 3, but it can also have a configuration as follows, as shown in FIG. 4: the main body is formed with high purity graphite; the top surface of it is covered with a multi-layered heat insulator 13; and the top of the heat insulator 13 is then covered with a cover 14 made of high purity graphite. Such a configuration is preferable because it is possible to prevent heat efflux from the bottom surface of the collar 12 and thus effectively prevent the deposition and adhesion of silicon oxide on the top end of 9 of the quartz crucible 5, as mentioned earlier. Also, the surface may be further coated with graphite deposition by mean of the vapor phase decomposition method. Silicon carbide or silicon nitride, instead of graphite, can be deposited thereon A cooling water path (not shown) is provided in the surrounding wall of the chamber 1. Cooling water is circulated in this path to cool the wall surface of the chamber 1.

Next, a process for growing a silicon single crystal using the apparatus for growing a single crystal is described. The polycrystalline silicon raw material which is put into the quartz crucible 5 is heated and melted by the heater 7 and the quartz crucible 5 is filled with a silicon melt 15. A seed crystal 16, hung from an upper axis 17, is then dipped in the silicon melt 15 and the seed crystal 16 is pulled at a prescribed rate while being rotated to grow a desired silicon single crystal rod 18 on the tip of the seed crystal 16.

As the pulled weight of the silicon single crystal rod 18 increases, the volume of the silicon melt 15 decreases and therefore the relative position of the surface of silicon melt 15 to the heater 7 changes gradually. In order to correct for the variations in temperature at the interface between the silicon single crystal rod 18 and the silicon melt 15 from the solidifying temperature due to this change, the quartz crucible 5 and the graphite crucible 6 are raised by the desired distance or the heater 7 is lowered by the desired distance based on calculations interlocked with the weight of the single crystal rod 18.

Figure 5:
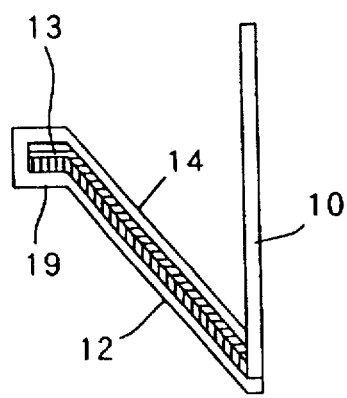
Figure 6:
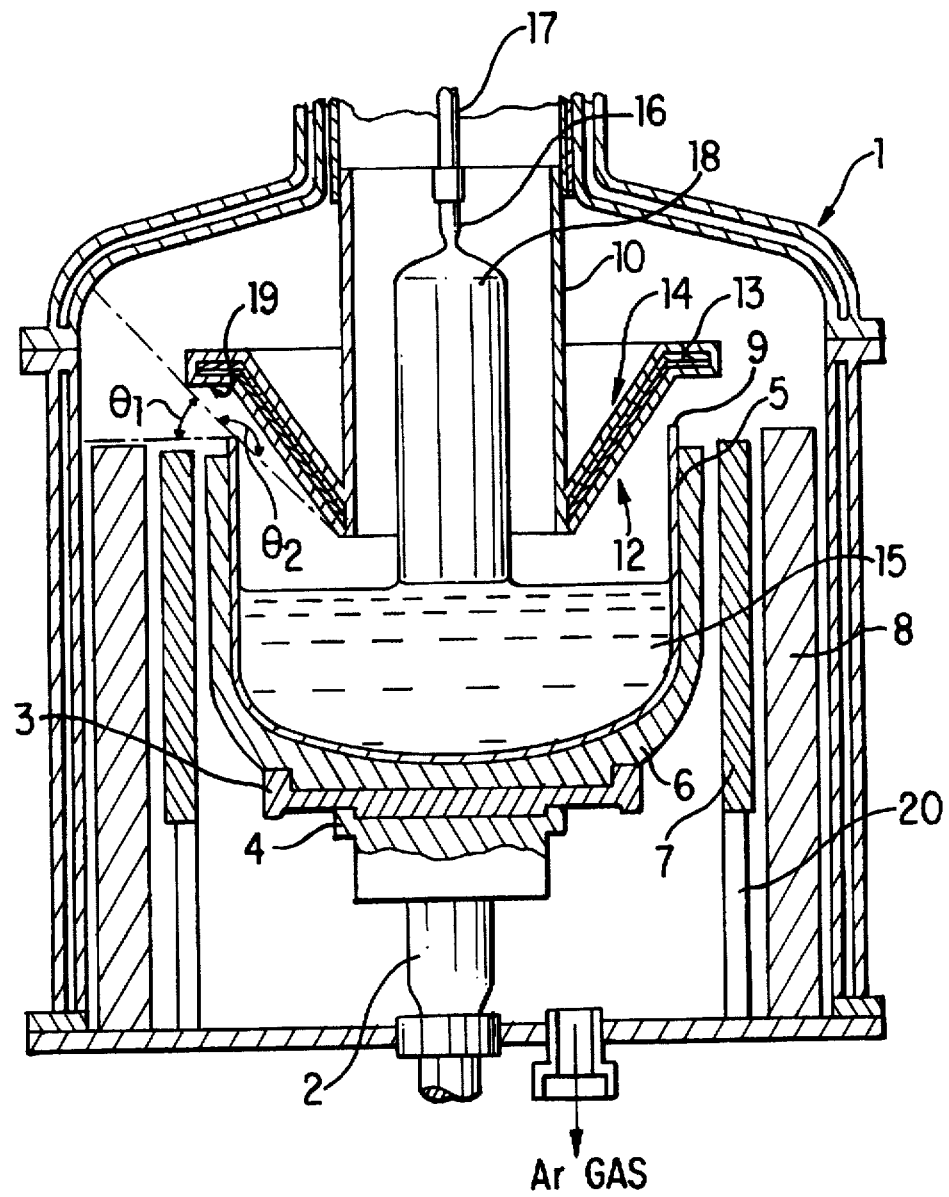
FIG. 6 is a vertical sectional view showing an apparatus for growing a single crystal according to another embodiment of the invention.

FIG. 6 is a vertical sectional view and shows another embodiment of an apparatus for growing a single crystal according to the present invention. In this embodiment, as shown in FIG. 5, the collar 12 is configured to have a horizontal area, i.e. a flange 19, on the outer circumferential part of the collar 12 in FIG. 4. Because of this configuration, the stereo angle $\theta_1$ of directly glancing at the inner wall of the chamber 1 from the top end 9 of the quartz crucible 5 becomes smaller, the stereo angle $\theta_2$ of directly glancing at the bottom surface of the collar 12 from the top end 9 of the quartz crucible 5 becomes larger, and the flange 19 receives a large amount of radiation heat from the heater 7, resulting in an increased effect of maintaining the temperature of the top end 9 of the quartz crucible 5.

Examples

Next, examples of growing a silicon single crystal rod by pulling it using the apparatus for growing a single crystal is shown.

The apparatus for growing a single crystal shown in FIG. 1 and the apparatus equipped with a smaller collar disclosed in Tokkai Hei 1-65086 as the prior art were used to pull single crystal rods. A platinum-platinum/rhodium thermocouple was installed on the top end 9 of the quartz crucible 5 to measure the temperature of the top end 9 of the quartz crucible 5 during the single crystal rod 18 is being pulled by each apparatus. These apparatuses have the same configuration except for the collars.

The specific pulling process is as follows. First, 210 kg of the polycrystalline silicon raw material was put into the quartz crucible 5 and heated and melted by the heater 7 to obtain a silicon melt 15 in the quartz crucible 5. A seed crystal 16, hung from above, was then dipped in the silicon melt 15, and the seed crystal 16 was pulled at a prescribed rate while being rotated to grow a single crystal rod 18 with a diameter of 300 mm at the tip of the seed crystal 16. As the pulled weight of the silicon single crystal rod 18 increased, the volume of the silicon melt 15 decreased and therefore the relative position of the surface of the silicon melt 15 to the heater 7 changed gradually. In order to maintain the temperature at the interface between the single crystal rod 18 and the silicon melt 15 at the solidifying temperature, the quartz crucible 5 and the graphite crucible 6 were raised by the desired distance based on calculations interlocked with the weight of the single crystal rod 18.

Next, the top end 9 of the quartz crucible 5 of each apparatus was visually observed to check whether or not deposition and adhesion of silicon oxide had occurred.

The top end 9 of the quartz crucible 5 was observed after the single crystal rod 18 was pulled using the apparatus of the embodiment of the present invention and cooled. Almost no adhesion of silicon oxide was observed. The temperature at the top end of the quartz crucible 5 measured 950° C.

On the other hand, when the apparatus disclosed in Tokkai Hei 1-65086 was used, dislocations were introduced into the single crystal rod 18 during the pulling process and a perfect single crystal was not obtained. After the single crystal rod 18 into which dislocations were introduced in the latter half was pulled, the top end 9 of the quartz crucible 5 was observed and it was discovered that deposition and adhesion of a large amount of silicon oxide had occurred and that some of it turned up like paper. Based on this result, the mechanism of the introduction of dislocations during the pulling up process is believed to be as follows: the paper-like deposition of the silicon oxide peels off, drops into the silicon melt 15, adheres to the single crystal rod 18 being pulled and causes dislocations in the single crystal rod 18. The temperature at the top of the quartz crucible 5 measured 940° C.

As shown clearly in the description thus far, the present invention can prevent the deposition and adhesion of silicon oxide on the top end of the quartz crucible and therefore a single crystal without dislocations can be obtained in a high-yield single crystal process.

What is claimed is:

1. A method for growing a single crystal which comprises the step of pulling a semiconductor single crystal rod from a semiconductor melt contained in a quartz crucible to grow a semiconductor single crystal:

wherein at least the temperature at the top end of said quartz crucible is maintained at 950° C. or higher during the pulling step of the semiconductor single crystal rod.

2. An apparatus for growing a single crystal which comprises a quartz crucible in a chamber for containing a semiconductor melt from which a semiconductor single crystal rod is pulled:

wherein there further comprises a cylinder concentrically surrounding the single crystal rod to be pulled whose top is connected to the edge of the opening at the center of the ceiling of said chamber in an airtight fashion and whose bottom hangs down toward said semiconductor melt; and said cylinder having a collar which spreads open upward and outward and whose outer circumferential part extends above the top end of said quartz crucible wherein said outer circumferential part is situated such that it does not touch said top end of said quartz crucible when said quartz crucible is at its highest position.

3. An apparatus for growing a single crystal of claim 2:

wherein said collar is made of high purity graphite;

a multi-layered heat insulator is provided to cover the upper surface of said collar; and the upper surface of said insulator is again covered with high purity graphite.

4. An apparatus for growing a single crystal of claim 3:

wherein the surface of said collar covered with said high purity graphite is coated with a material selected from graphite, silicon carbide or silicon nitride deposition by means of the vapor decomposition method.

5. An apparatus for growing a single crystal of claim 2:

wherein a horizontal area is provided on the outer circumferential part of said collar.

6. An apparatus for growing a single crystal which comprises a quartz crucible in a chamber for containing a semiconductor melt from which a semiconductor single crystal rod is pulled:

wherein there further comprises a cylinder concentrically surrounding the single crystal rod to be pulled whose top is connected to the edge of the opening at the center of the ceiling of said chamber in an airtight fashion and whose bottom hangs down toward said semiconductor melt; and a collar which spreads open upward and outward and whose outer circumferential part extends above the top end of said quartz crucible wherein said outer circumferential part is situated such that it does not touch said top end of said quartz crucible when said quartz crucible is at its highest position;

wherein said collar is made of high purity graphite;

a multi-layered heat insulator is provided to cover the upper surface of said collar; and the upper surface of said insulator is again covered with high purity graphite.

7. An apparatus for growing a single crystal according to claim 6:

wherein the surface of said collar covered with said high purity graphite is coated with a material selected from graphite, silicon carbide, or silicon nitride deposition by means of the vapor decomposition method.

8. An apparatus for growing a single crystal according to claim 6:

wherein a horizontal area is provided on the outer circumferential part of said collar.

* * * * *